United States Patent
Hung et al.

(10) Patent No.: US 8,724,390 B2
(45) Date of Patent: May 13, 2014

(54) ARCHITECTURE FOR A 3D MEMORY ARRAY

(75) Inventors: Chun-Hsiung Hung, Hsinchu (TW); Shuo-Nan Hung, Hsinchu (TW); Ji-Yu Hung, Miaoli (TW); Shih-Lin Huang, Penghu (TW); Fu-Tsang Wang, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 214 days.

(21) Appl. No.: 13/245,587

(22) Filed: Sep. 26, 2011

(65) Prior Publication Data
US 2012/0182804 A1      Jul. 19, 2012

Related U.S. Application Data

(60) Provisional application No. 61/434,120, filed on Jan. 19, 2011, provisional application No. 61/532,460, filed on Sep. 8, 2011.

(51) Int. Cl.
*G11C 11/34*      (2006.01)

(52) U.S. Cl.
USPC .............. 365/185.13; 365/185.18; 365/203; 365/63; 365/204

(58) Field of Classification Search
USPC .................. 365/185.13, 185.18, 203, 204, 63
See application file for complete search history.

(56) References Cited

U.S. PATENT DOCUMENTS

| | | | |
|---|---|---|---|
| 6,906,940 B1 | 6/2005 | Lue | |
| 7,227,783 B2 * | 6/2007 | Li | 365/185.18 |
| 7,433,235 B2 * | 10/2008 | Chae et al. | 365/185.18 |
| 7,453,729 B2 * | 11/2008 | Lee | 365/185.18 |

OTHER PUBLICATIONS

Lai E-K et al., "A Multi-Layer Stackable Thin-Film Transistor (TFT) NAND-Type Flash Memory," IEEE Int'l Electron Devices Meeting, Dec. 2006, 4pp.
Jung S-M et al., "Three Dimensionally Stacked NAND Flash Memory Technology Using Stacking Single Crystal Si Layers on ILD and TANOS Structure for Beyond 30 nnm Node," IEEE Int'l Electron Devices Meeting, Dec. 2006, 4pp.
Johnson M. et al., "512-Mb PROM With a Three-Dimensional Array of Diode/Antifuse Memory Cells," IEEE Journ. Solid-State Circuits 83(11), Nov. 2003, pp. 1920-1928.
Paul B.C. et al., "Impact of a Process Variation on Nanowire and Nanotube Device Performance," IEEE Transactions on Electron Devices 54:9 Sep. 2007, pp. 2369-2376.
U.S. Appl. No. 13/018,110, filed Jan. 31, 2011 by Hung et al.
U.S. Appl. No. 13/078,311, filed Apr. 1, 2011 by Chen et al.

* cited by examiner

*Primary Examiner* — Son Dinh
(74) *Attorney, Agent, or Firm* — Haynes Beffel & Wolfeld LLP

(57) ABSTRACT

Techniques are described herein for compensating for threshold voltage variations among memory cells in an array by applying different bias conditions to selected bit lines. Techniques are also described herein for connecting global bit lines to a variety of levels of memory cells in a 3D array, to provide for minimizing capacitance differences among the global bit lines.

21 Claims, 14 Drawing Sheets

ARCHITECTURE FOR A 3D MEMORY ARRAY

CROSS-REFERENCE TO RELATED APPLICATIONS

The benefit is claimed of U.S. Provisional Application No. 61/434,120 entitled "Compensation of the VT Difference of Memory Cell in a During Read Operation in a 3D Nonvolatile Memory" filed 19 Jan. 2011, which is incorporated by reference herein.

BACKGROUND

1. Field

The present technology relates to high density memory devices in which variations in cell characteristics can vary within array, such as memory devices in which multiple levels of memory cells are arranged to provide a three-dimensional 3D array.

2. Description of Related Art

As critical dimensions of devices in integrated circuits shrink to the limits of common memory cell technologies, and arrays become very large, memory cell within an array can have characteristics that vary in a manner that affects sensing margins. In one trend to achieve high density, designers have been looking to techniques for stacking multiple levels of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple levels of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In a 3D array, differences in the electrical characteristics of structures on the various levels can lead to differences in the dynamics of programming, erasing, and charge storage, including variations in threshold voltages corresponding to memory states of memory cells on the various levels. Thus, to achieve the same threshold voltages, within acceptable margins for every level, the programming and erasing processes have to be adapted to vary with the level of the target cell in some way. These variations can lead to endurance problems with the memory cells and to other complexities.

In a 3D array, access lines, such as global bit lines, arranged for use to access the various levels of the array can be laid out so that characteristics such as capacitance and inductance encountered by circuits coupled to the access lines can vary depending on the location, such as which level in the array, of the cell being accessed. For example, global bit lines typically extend to decoder circuitry used for reading and writing the memory cells. Differences among the vertical connections to the various levels, and other differences among the levels, can lead to variations in capacitance among the global bit lines. These variations in capacitance affect the global bit line voltages during read, program and erase operations, and can result in specification requirements, such as larger read margins between programmed and erased states, and slower sensing times to account for worst case capacitances.

It is therefore desirable to provide technologies that compensate for variations in cell characteristics within an array, and also to provide a three-dimensional integrated circuit memory that reduces complexities arising from the differences among the levels.

SUMMARY

Techniques are described herein for compensating for threshold voltage variations among memory cells in an array by applying different bias conditions to selected bit lines.

The compensation technology can be deployed in memory architectures including 3D arrays, and to memory architectures that do not include 3D arrays, to provide for managing dynamic cell characteristics that result in threshold voltage variations.

In a 3D array, level-dependent read operations are described which compensate for the threshold voltage variation among the levels by applying different read bias conditions to bit lines, preferably the local bit lines, in each level of the array.

Techniques are also described herein for connecting access lines, including global bit lines, to a variety of levels of memory cells in a 3D array, which can provide for minimizing capacitance differences among the global bit lines.

DETAILED DESCRIPTION

Figure 1:
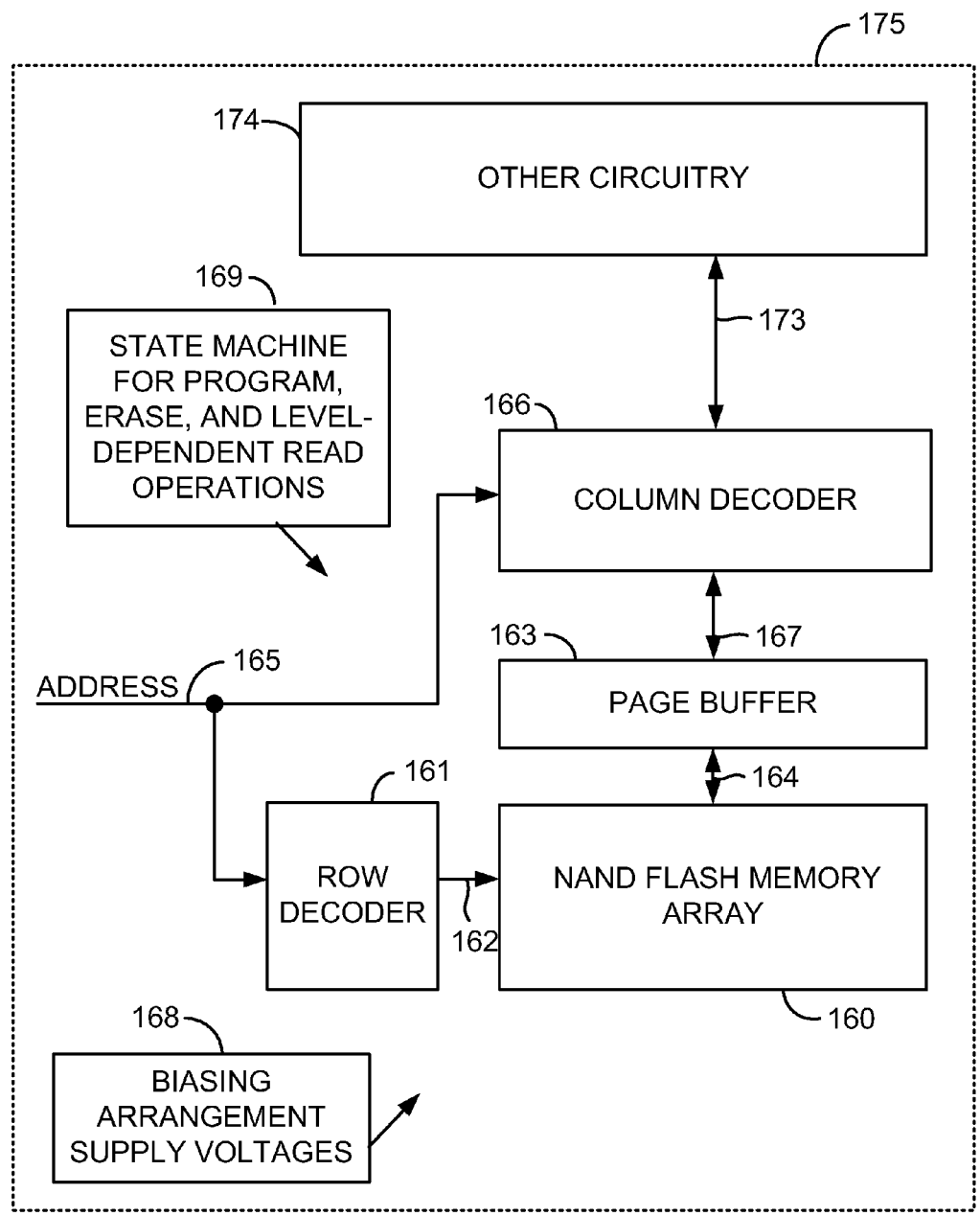
FIG. 1 is a simplified block diagram of an integrated circuit including a NAND flash memory array which can be operated as described herein.

Techniques are described herein for compensating for threshold voltage variations among memory cells in an array by applying different bias conditions to selected bit lines.

The compensation technology can be deployed in memory architectures including 3D arrays, and to memory architectures that do not include 3D arrays, to provide for managing dynamic cell characteristics that result in threshold voltage variations.

An integrated circuit device as described herein includes a memory array and bias circuits. The bias circuits compensate for variations in threshold voltages that correlate with the location of the selected memory cell within the physical configuration of the memory array, where the threshold voltages correspond to memory states of memory cells in the array, by applying different bias conditions to bit lines for selected memory cells during a read operation, or other operation on the cell. These variations in threshold voltage that correlate with the location of the selected memory cell within the physical arrangement of the memory array, such as variations that correlate with the levels or planes of memory cells in a 3D array, are to be distinguished from the variations in threshold voltage that are induced to establish multiple threshold levels to store more than one bit per cell.

The different biasing conditions can be applied simultaneously to a plurality of bit lines, such as during a page access, where the cells in the page can be disposed in different locations within the array. Bias conditions are applied "simultaneously" for the purposes of the present description, if they are applied overlapping in time during a read access providing data from a plurality of memory cells in response to a single read command, such a during a page read.

In a 3D array, level-dependent read operations are described which compensate for the threshold voltage variation among the levels by applying different read bias conditions to the local bit lines in each level of the array. The level-dependent read operations can be deployed without applying different word line WL voltages, or in combination with varying WL voltages in array architectures that allow it.

An integrated circuit described herein includes a memory array including a plurality of levels of memory cells. Levels in the plurality of levels include local bit lines and memory cells coupled to the local bit lines. Global bit lines are coupled to corresponding sets of local bit lines in the array. The integrated circuit includes decoding circuitry to select memory cells in the memory array. The integrated circuit further includes bias circuits coupled to the global bit lines for providing selected bias voltages. The bias circuits are responsive to control signals to select a bias voltage for the global bit line that corresponds to the selected memory cells.

Techniques are also described herein for connecting global bit lines to a variety of levels of memory cells in a 3D array, which can provide for minimizing capacitance differences among the global bit lines. In one aspect, the connectors to the various levels are arranged on the global bit lines such that a statistical function (e.g. a sum, mean, etc.) of level indices of the levels connected to the each of the global bit lines, is equal to a constant.

An integrated circuit as described herein includes a plurality of blocks. Blocks in the plurality of blocks comprise a plurality of levels $L(z)$. Levels $L(z)$ in the plurality of levels include respective two dimensional arrays of memory cells having a plurality of word lines along rows, and a plurality of local bit lines along columns, coupled to corresponding memory cells in the array. The integrated circuit further includes a plurality of global bit lines. Global bit lines in the plurality of global bit lines include a plurality of connectors. Connectors in the plurality of connectors coupled to a given global bit line are coupled to corresponding local bit lines in the plurality of blocks. In embodiments described here, on a given global bit line, the corresponding local bit line in one of the plurality of blocks is on a different level $L(z)$ than the corresponding local bit line in another of the plurality of blocks. By coupling the same global bit line to different levels in different blocks along the line, the capacitance of the global bit line can be adjusted. Also, applying this design approach to a set of global bit lines that share a plurality of blocks of memory cells, the capacitance of each member of the set of global bit lines can be close to the same. Bias circuits can be coupled to the plurality of global bit lines that compensate for variations in threshold voltages corresponding to memory states of selected memory cells, based on the level $L(z)$ of the selected memory cell.

A detailed description of embodiments of the present invention is provided with reference to FIGS. 1-17.

FIG. 1 is a simplified block diagram of an integrated circuit 175 including a NAND flash memory array 160 which can be operated as described herein. In some embodiments, the array 160 can include multiple levels of cells. A row decoder 161 is coupled to a plurality of word lines 162 arranged along rows in the memory array 160. Column decoders in block 166 are coupled to a set of page buffers 163 in this example via data bus 167. The global bit lines 164 are coupled to local bit lines (not shown) arranged along columns in the memory array 160. Addresses are supplied on bus 165 to column decoder (block 166) and row decoder (block 161). Data is supplied via the data-in line 173 from other circuitry 174 (including for example input/output ports) on the integrated circuit, such as a general purpose processor or special purpose application circuitry, or a combination of modules providing system-on-a-chip functionality supported by the array 160. Data is supplied via the line 173 to input/output ports or to other data destinations internal or external to the integrated circuit 175.

A controller, implemented in this example as a state machine 169, provides signals to control the application of bias arrangement supply voltages generated or provided through the voltage supply or supplies in block 168 to carry out the various operations described herein. These operations include erase, program and level-dependent read with different read bias conditions for each level of the array 160. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level or highest threshold level, as suits a designer. Further, the term "write" as used herein describes an operation which changes the threshold voltage of a memory cell, and is intended to encompass both program and erase.

Figure 2:
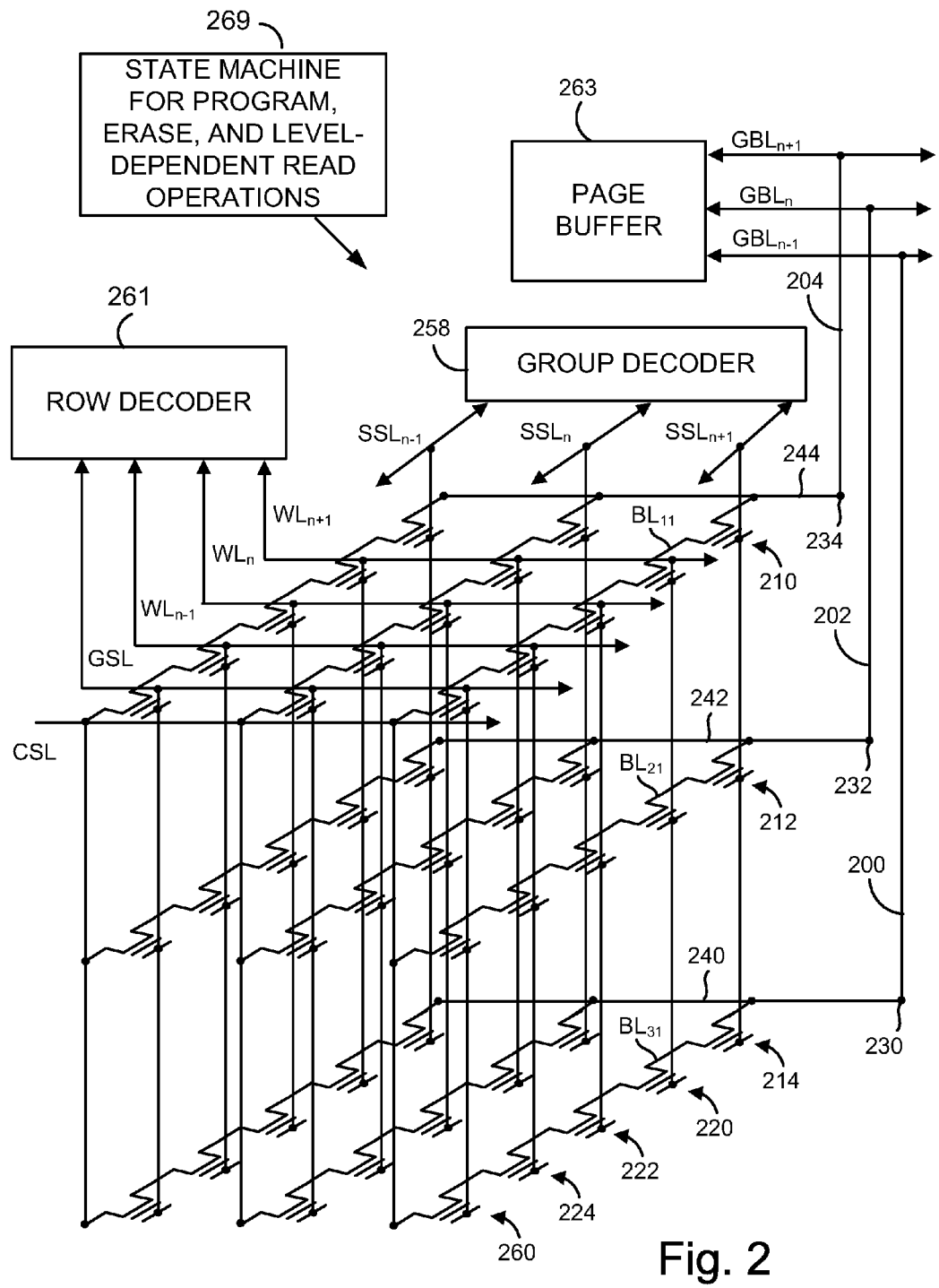
FIG. 2 is a schematic diagram of a portion of a 3D NAND flash memory array.

FIG. 2 is a schematic diagram of a portion of the 3D NAND flash memory array usable in a device like that of FIG. 1. In this example three levels of memory cells are illustrated, which is representative of a block of memory cells that can include many levels.

A plurality of word lines including word lines $WL_{n-1}$, $WL_n$, $WL_{n+1}$ extend in parallel along a first direction. The word lines are in electrical communication with row decoder 261. The word lines are connected to the gates of the memory cells, which are arranged in series as NAND strings. Word line $WL_n$ is representative of the word lines. As shown in FIG. 2, the word line $WL_n$ is vertically connected to the gates of the memory cells in each of the various levels underlying the word line $WL_n$.

A plurality of local bit lines is arranged along columns to form NAND strings in the various levels of the memory array. As shown in FIG. 2, the array includes a local bit line $BL_{31}$ on the third level, a local bit line $BL_{21}$ on the second level, and local bit line $BL_{11}$ on the first level. The memory cells have dielectric charge trapping structures between the corresponding word lines and the corresponding local bit lines. In this illustration, there are three memory cells in a NAND string for simplicity. For example, a NAND string formed by local bit line $BL_{31}$ on the third level comprises memory cells 220, 222, 224. In a typical implementation, a NAND string may comprise 16, 32 or more memory cells.

A plurality of string select lines including string select lines $SSL_{n-1}$, $SSl_n$, $SSl_{n+1}$ are in electrical communication with group decoder 258 (which could be part of the row decoder 261), which selects a group of strings. The string select lines are connected to the gates of string select transistors arranged at the first ends of the memory cell NAND strings. As shown in FIG. 2, each of the string select lines are vertically connected to the gates of a column of the string select transistors in each of the various levels. For example, string select line $SSL_{n+1}$ is connected to the gates of string select transistors 210, 212, 214 in the three levels.

The local bit lines on a particular level are selectively coupled to an extension on the particular level by the corresponding string select transistors. For example, the local bit lines on the third level are selectively coupled to extension 240 by the corresponding string select transistors in that level. Similarly, the local bit lines on the second level are selectively coupled to extension 242, and local bit lines on the first level are selectively coupled to extension 244.

The extensions on each of the levels include a corresponding contact pad for contact with a vertical connector coupled to a corresponding global bit line. For example, extension 240 in the third level is coupled to a global bit line $GBL_{n-1}$ via contact pad 230 and vertical connector 200. Extension 242 on the second level is coupled to a global bit line $GBL_n$ via contact pad 232 and vertical connector 202. Extension 244 on the third level is coupled to a global bit line $GBL_{n-1}$.

The global bit lines $GBL_{n-1}$, $GBL_n$, and $GBL_{n+1}$ are coupled to additional blocks (not shown) in the array and extend to page buffer 263. In this manner a 3D decoding network is established, in which a page of selected memory cells is accessed using one word line, all or some of the bit lines and one string select line.

Block select transistors are arranged at the second ends of the NAND strings. For example, block select transistor 260 is arranged at the second end of the NAND string formed by memory cells 220, 222, 224. A ground select line GSL is connected to the gates of the block select transistors. The ground select line GSL is in electrical communication with the row decoder 261 to receive bias voltages during operations described herein.

The block select transistors are used to selectively couple second ends of all the NAND strings in the block to a reference voltage provided on common source line CSL. The common source line CSL receives bias voltages from the bias circuit (not shown here) during operations described herein. In some operations described herein, the CSL is biased to a reference voltage that is higher than that of a bit line coupled to the opposite end of a NAND string, rather than in the more traditional "source" role at or near ground.

Figure 3:
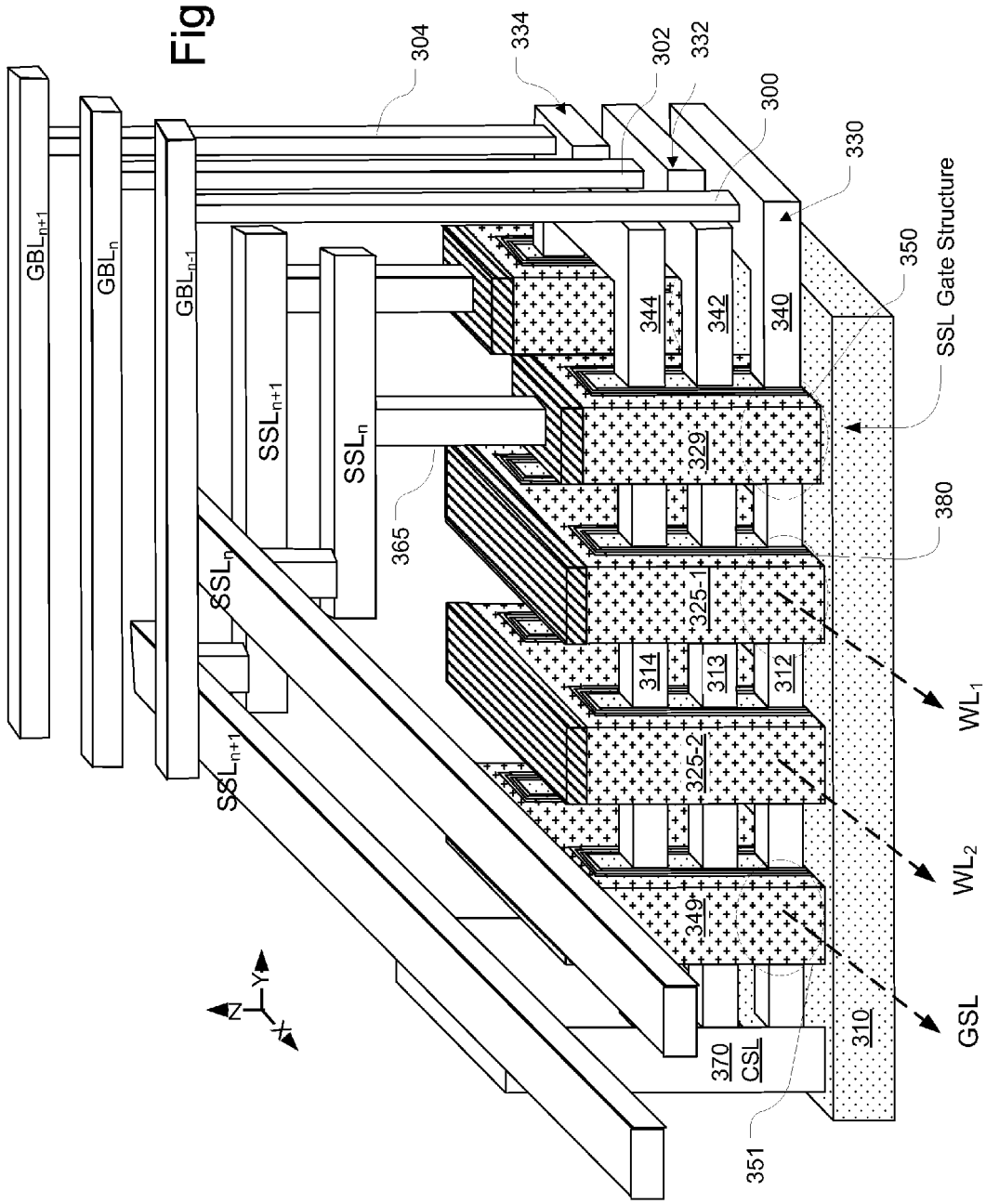
FIG. 3 is an exemplary perspective view of a portion of a 3D NAND flash memory array.

FIG. 3 is an exemplary perspective view of a portion of one example of a 3D NAND flash memory array with which a level dependent bias can be applied during read operations, to account for variations in threshold voltages that correlate with the level of the selected cell. In FIG. 3, fill material has been removed to give a view of the word lines and bit lines that make up the 3D array.

The memory array is formed on an insulating layer 310 over an underlying semiconductor or other structures (not shown). The memory array includes a plurality of conductive lines 325-1, 325-2, acting as the word lines $WL_1$, $WL_2$, and arranged for connection to the row decoder. A layer of silicide can be formed on the top surfaces of the conductive lines 325-1, 325-2.

The conductive lines 325-1, 325-2 are conformal with semiconductor material strips acting as the local bit lines in the various levels. For example, semiconductor material strip 312 acts as a local bit line in the third level, semiconductor material strip 313 acts as a local bit line in the second level, and semiconductor material strip 314 acts as a local bit line in the first level. The semiconductor material strips are separated by insulating layers (not shown).

The semiconductor material strips can be a p-type semiconductor material. The conductive lines 325-1, 325-2 can be a semiconductor material with the same or a different conductivity type, or other conductive word line material. For example, the semiconductor material strips can be made using p-type polysilicon, or p-type single crystal silicon, while the conductive lines 325-1, 325-2 can be made using relatively heavily doped p+-type polysilicon.

Alternatively, the semiconductor material strips can be n-type semiconductor material. The conductive lines 325-1, 325-2 can be a semiconductor material with the same or a different conductivity type. This n-type strip arrangement results in buried-channel, depletion mode charge trapping memory cells. For example, the semiconductor material strips can be made using n-type polysilicon, or n-type single crystal silicon, while the conductive lines 325-1, 325-2 can be made using relatively heavily doped p+-type polysilicon. A typical doping concentration for n-type semiconductor material strips can be around $10^{18}/cm^3$, with usable embodiments likely in the range of $10^{17}/cm^3$ to $10^{19}/cm^3$. The use of n-type semiconductor material strips can be particularly beneficial in junction-free embodiments to improve conductivity along the NAND strings and thereby allowing higher read current.

The memory cells have charge storage structures between the conductive lines 325-1, 325-2 and the semiconductor material strips acting as the local bit lines. For example, memory cell 380 is formed between conductive line 325-1 and semiconductor material strip 312 acting as a local bit line in the third level. In this illustration, there are two memory cells in a NAND string for simplicity. In the embodiment described here, each memory cell is a double gate field effect transistor having active charge storage regions on both sides of the interface between the corresponding semiconductor material strip and the conductive lines 325-1, 325-2.

In this example the charge storage structures comprise a tunneling layer, a charge trapping layer, and a blocking layer. In one embodiment, the tunneling layer is silicon oxide (O), the charge storage layer is silicon nitride (N), and the blocking dielectric layer is silicon oxide (O). Alternatively, the memory cells may comprise other charge storage structures, including for example silicon oxynitride ($Si_xO_yN_z$), silicon-rich nitride, silicon-rich oxide, trapping layers including embedded nano-particles and so on.

In one embodiment, a bandgap engineered SONOS (BE-SONOS) charge storage structure can be used which includes a dielectric tunneling layer that includes a combination of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer in this embodiment comprises silicon dioxide formed on the side surface of the semiconductor material strips using for example in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

String select lines $SSL_n$, $SSL_{n+1}$ are connected to gates of string select transistors at the first ends of the memory cell NAND strings. The string select transistors are formed between the semiconductor material strip of the corresponding NAND string and a multi-level string select gate structure. For example, string select transistor 350 is formed between the semiconductor material strip 312 and the string select gate structure 329. The string select gate structure 329 is coupled to the string select line $SSL_n$ via contact plug 365.

The semiconductor material strips are selectively coupled to the other semiconductor material strips in the same level by extensions. For example, the semiconductor material strips in the third level are selectively coupled to one another via extension 340. Similarly, the semiconductor material strips in the second level are selectively coupled to one another via extension 342, and the semiconductor material strips in the first level are selectively coupled to extension 344.

Extension 340 in the third level is coupled to a global bit line $GBL_{n-1}$ via contact pad 330 and vertical connector 300. Extension 342 in the second level is coupled to a global bit line $GBL_n$ via contact pad 332 and vertical connector 302. Extension 344 on the third level is coupled to a global bit line $GBL_{n+1}$.

The global bit lines $GBL_{n-1}$, $GBL_n$, and $GBL_{n+1}$ are coupled to additional blocks (not shown) in the array and extend to page buffer 263.

Block select transistors are arranged at the second ends of the NAND strings. For example, block select transistor 351 is arranged at the second end of the NAND string formed by semiconductor material strip 312. Gate structure 349, acting as ground select line GSL, is connected to the gates of the block select transistors.

The block select transistors are used to selectively couple second ends of all the NAND strings in the block to a reference voltage provided on common source line CSL 370. CSL 370 extends parallel with the word lines.

The structure illustrated in FIG. 3 can be manufactured for example utilizing the techniques described in U.S. patent application Ser. No. 13/018,110 filed 31 Jan. 2011, which is incorporated by reference herein as if fully set forth herein.

In operation, each of the memory cells store a data value depending upon their threshold voltage. Reading or writing of a selected memory cell can be achieved by applying appropriate voltages to the word lines, bit lines, string select lines, ground select line and common source line.

In a programming operation, appropriate voltages are applied to induce a tunneling of electrons into the charge storage layer of the selected memory cell. The programming operation increases the threshold voltage of the selected memory cell. The selected memory cell may be programming using for example Fowler-Nordheim (FN) electron tunneling.

In an erase operation, appropriate voltages are applied to induce hole tunneling into the charge storage layer of the selected memory cell, or to induce electron tunneling from the charge storage layer. The erase operation decreases the threshold voltage of the selected memory cell.

In a read operation, appropriate read voltages are applied, so that current flowing through a selected memory cell can be sensed. The data value may be determined based on the current flowing through the selected memory cell during the read operation. The read voltages may be selected such that an erased memory cell turns on (i.e. conducts current) during the read operation, while a programmed memory cell remains off (i.e. conducts little to no current).

Figure 4:
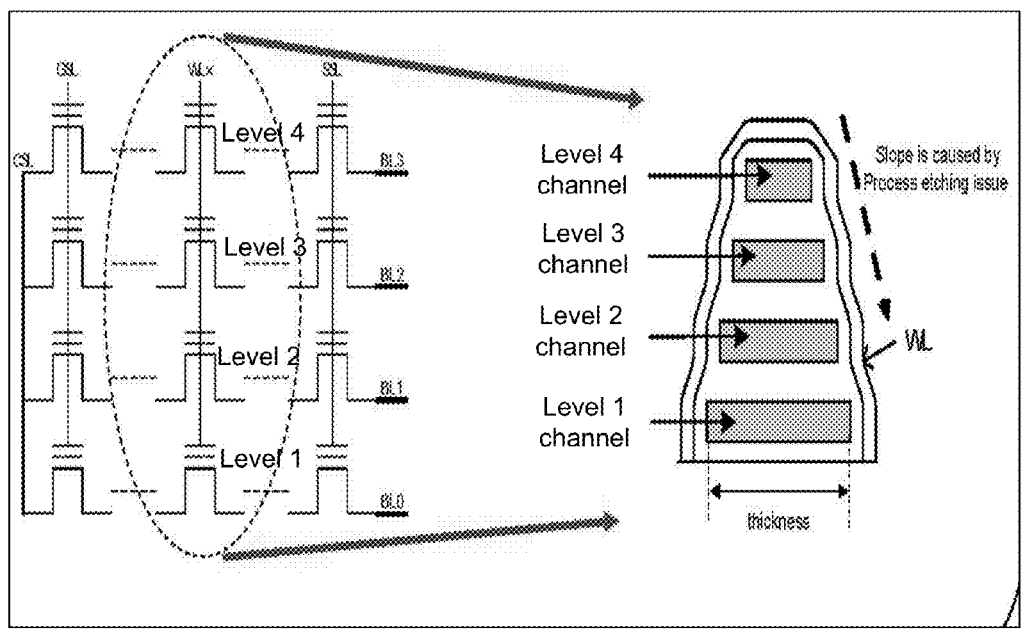
FIG. 4 illustrates an example where the thicknesses of the semiconductor material strips which form the memory cell channel regions in the lower levels are greater than the thicknesses in the upper levels.

In a 3D array, differences among the levels can lead to differences in charge storage dynamics, and to variations in threshold voltages corresponding to memory states of memory cells on the various levels. FIG. 4 illustrates an example where the thickness (from side to side) of the semiconductor material strips which form the channel regions of the memory cells in the lower levels are greater than the thicknesses in the upper levels.

This difference in the channel thickness can arise due to the etching processes used to form the device.

Figure 5:
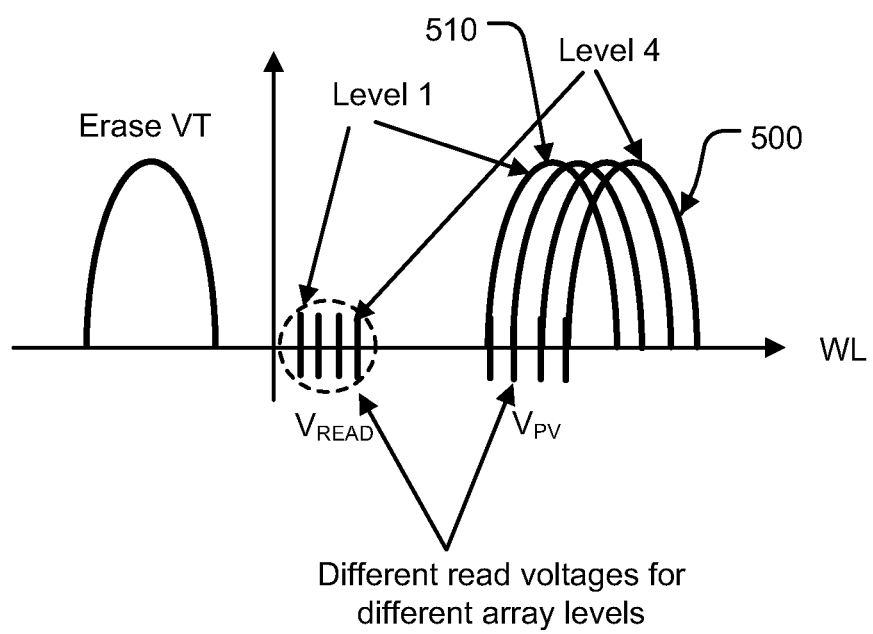
FIG. 5 illustrates example distributions of the threshold voltage for a number of programmed memory cells in four different levels.

If the same programming and erasing operations are utilized for each level of memory cells, these differences in channel thickness, and other differences among the levels, can lead to a wide distribution in the threshold voltages of memory cells on the various levels. FIG. 5 illustrates example distributions of the threshold voltage for a number of programmed memory cells in four different levels. In the example shown in FIG. 5, the programmed memory cells in Level 4 have a threshold voltage within a distribution 500 which is generally higher than the distribution 510 of programmed memory cells in Level 1.

Thus, to achieve the same threshold voltages for a particular memory state for every level of memory cells, the programming and erasing processes can be adapted to vary with the level of the selected memory cell in some way. These adaptations can lead to endurance problems with the memory cells, and to other complexities.

In addition, if the same read operation is utilized for each level, the threshold voltage variation between memory cells on the various levels diminishes the read margin between programmed and erased states. More narrow read margins require more complex circuitry, and can result in slower read processes.

One technique for achieving a wider read margin is to apply a lower word line voltage for reading and verifying the memory cells in the lower levels, and higher word line voltages for reading and verifying the memory cells in the higher levels. This approach is represented in FIG. 5 by the four different lines for read voltages labeled $V_{READ}$ and the four different lines for program verify voltages labeled $V_{PV}$. However, since the word lines are coupled to memory cells in each level in the array configuration illustrated in FIGS. 2 and 3, applying different word line voltages based on the level of the selected memory cell precludes reading memory cells in each level simultaneously.

Level-dependent read operations described herein compensate for the threshold voltage variation by applying different read bias conditions to the bit lines for access to cells in each level of the array 160, so that the current on the bit lines for read operations on the different levels remains within a tighter distribution even in the presences of varying threshold voltages for the memory cells on the different levels. In doing so, the techniques described herein can maintain a relatively wide read margin between programmed and erased states for each level, without requiring different read word line voltages.

Figure 6:
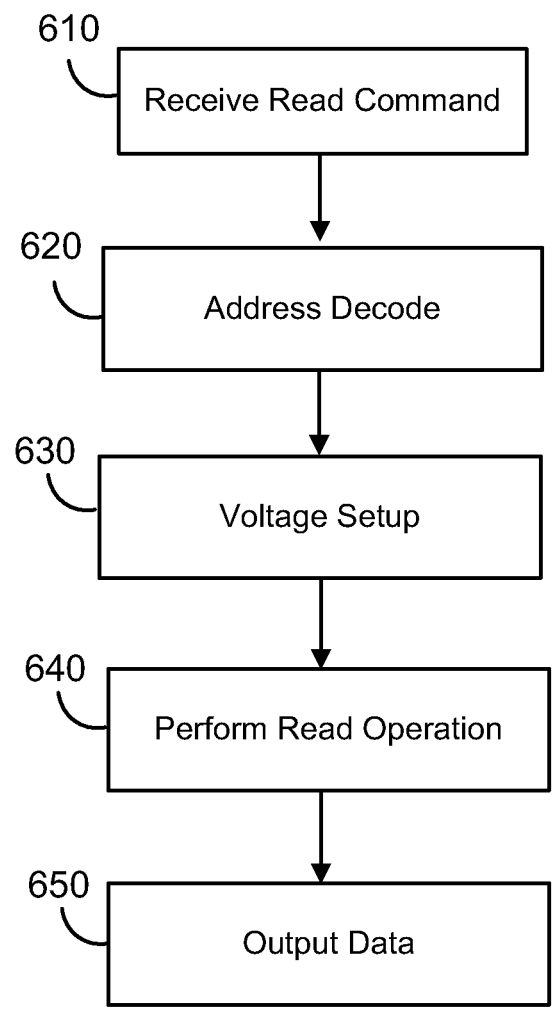
FIG. 6 is a flow chart of an operational sequence for performing a level-dependent read operation as described herein.

FIG. 6 is a flow chart of an operational sequence 600 for performing a level-dependent read operation as described herein.

At step 610, a read command for a particular address is received.

At step 620, the address is decoded by decoder circuitry to identify the physical location, such as the level in a 3D embodiment, of the selected memory cell associated with the address. The decoder circuitry is responsive to the address to generate control signals that indicate the location of the selected memory cell.

At step 630, bias circuitry is responsive to the control signals to precharge the bit line of the selected memory cell to a voltage level which is dependent upon the location or level of the selected memory cell.

At step 640, the read operation is performed on the selected memory cell to determine the stored data value. At step 650, the data is then output from the page buffer.

Figure 7:
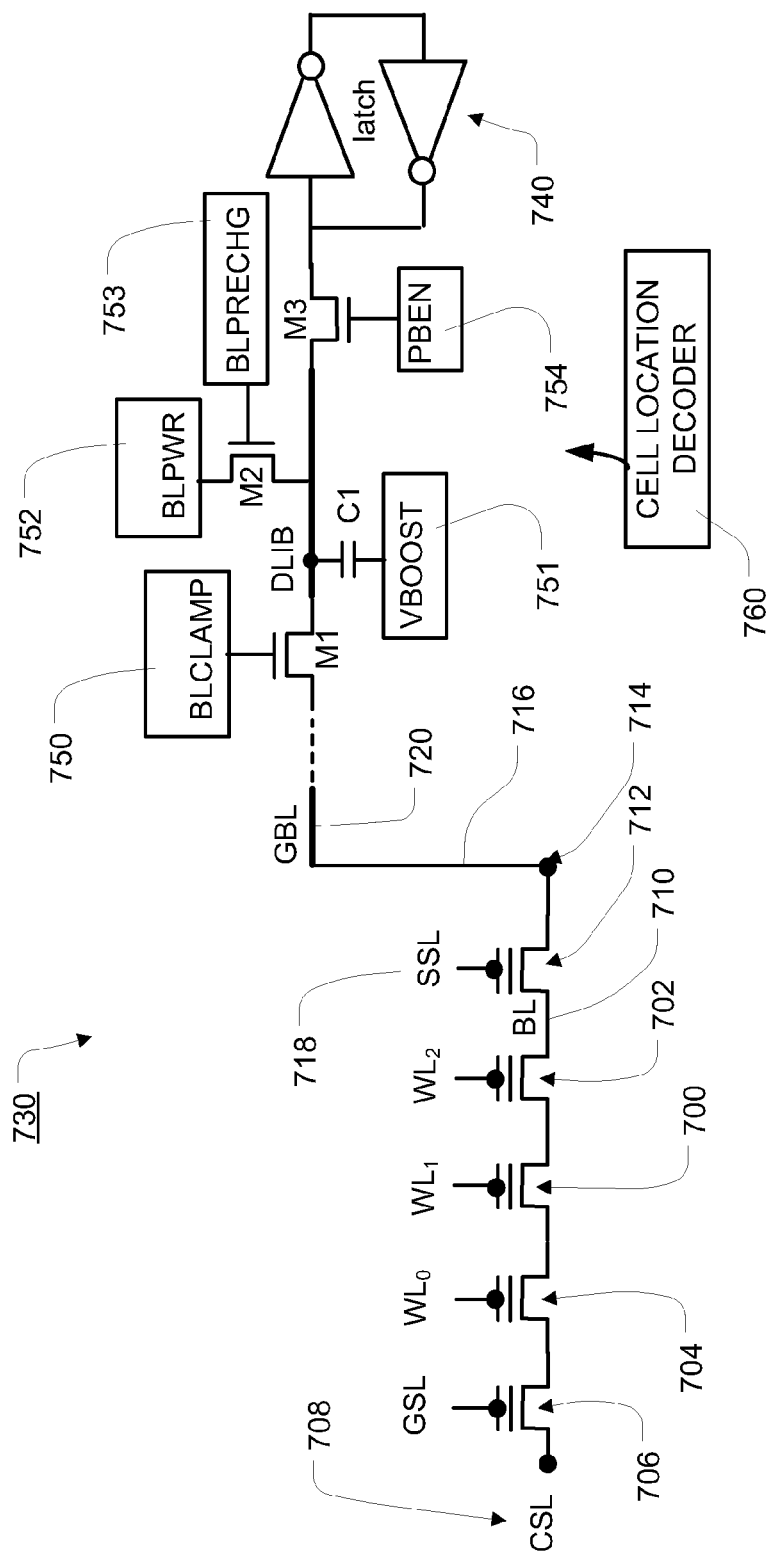
FIG. 7 is a schematic diagram of a circuit suitable for use in performing a level-dependent read operation on a selected memory cell.

FIG. 7 is a schematic diagram of a circuit suitable for use in performing a level-dependent read operation on a selected memory cell 700. In this example, the read is level dependent. In other examples, the read can be dependent on the location of the selected memory cell within other sectors or segments of a 3D or 2D array, where cells within the sector or segment have read characteristics that fall within a particular range.

The selected memory cell 700 is part of a NAND string formed by local bit line BL 710 in a particular level of the array. The NAND string also includes memory cell 702 and memory cell 704. String select transistor 712 selectively couples the bit line 710 to the global bit line 720 via contact pad 714 and vertical connector 716. The gate of the string select transistor 712 is connected to string select line SSL 718.

Block select transistor 706 selectively couples the second end of the NAND string to common source line CSL 708.

The global bit line 720 is coupled by column decoder circuitry (not shown) to sensing circuitry 730 via a page buffer circuit for the global bit line 720. Signals BLCLAMP, VBOOST, BLPWR, BLPRECHG and PBEN are provided by voltage sources and the control logic (schematically represented by boxes 750-754) used to control the timing and performance of a read operation that includes a precharge interval and a sensing internal, as explained below with reference to the timing diagram of FIG. 8. A cell location decoder 760 is used to provide cell location information for use in producing the VBOOST signal and the BLCLAMP signal as described below, based on the location of the selected cell in a particular level, or other sector or segment, of the array. In some embodiments, the cell location decoder 760 is the same circuit as used for plane decoding for a 3D array (See, e.g., FIG. 15).

Clamp transistor M1 is coupled between the global bit line 720 and data line DLIB. Signal BLCLAMP is connected to the gate of the clamp transistor M1.

Precharge transistor M2 has a first terminal connected to the data line DLIB, a second terminal coupled to bit line power BLPWR signal, and a gate coupled to signal BLPRECHG. Controllable voltage source 752 applies the BLPWR signal at a voltage level and timing that depend on the control sequence being executed. Control circuit 753 applies the BLPRECHG signal at a voltage level and timing that depend on the control sequence being executed.

A signal VBOOST is also coupled to the data line DLIB via capacitor C1. Controllable voltage source 751 applies the VBOOST signal at a voltage level and timing that depend on the control sequence being executed.

An enable transistor M3 is arranged between the data line DLIB and latch based sense amplifier circuit 740. Control signal PBEN is connected to the gate of the enable transistor M3. Control logic 754 applies the PBEN signal at a voltage level and timing that depend on the control sequence being executed.

Figure 8:
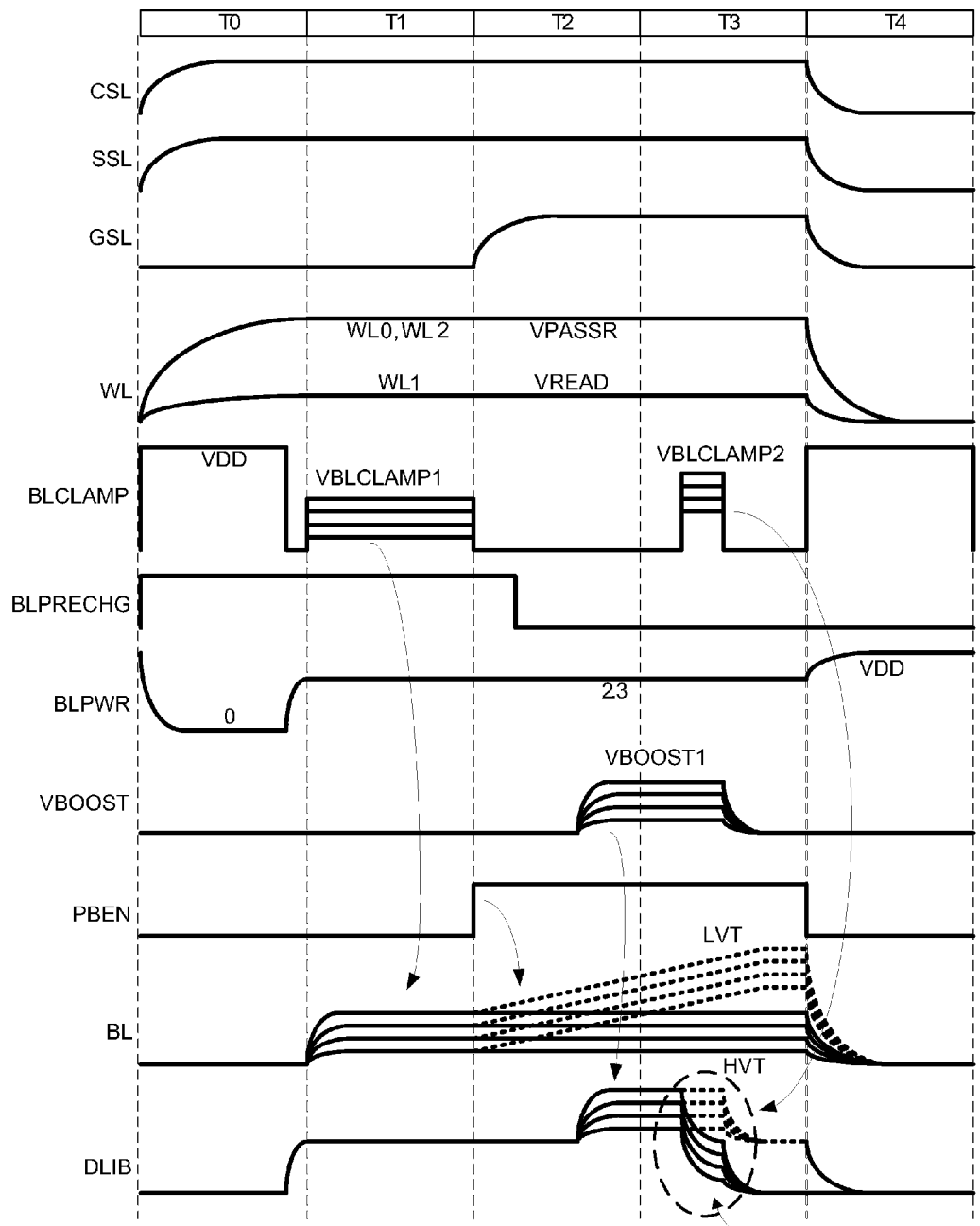
FIG. 8 is an exemplary timing diagram for operating the circuit illustrated in FIG. 7 to perform a level-dependent read operation.

FIG. 8 is an exemplary timing diagram for operating the circuit illustrated in FIG. 7 to perform a level-dependent read operation on a selected memory cell 700. The control circuit on the integrated circuit is arranged to cause a sequence during a read operation by controlling the biasing circuits, word lines, and other circuits in the memory array, as shown in FIG. 8.

Upon initiating a read operation, control signals BLCLAMP, VBOOST, BLPWR, BLPRECHG and PBEN are applied to control the timing of the read operation.

During time interval T0, the word lines WL0 and WL2, coupled to the gates of the unselected memory cells 704 and 702, are charged to a voltage value VPASSR sufficient to turn on the unselected memory cells 704 and 702. The word line WL1 coupled to the gate of the selected memory cell 700 is charged to a voltage value VREAD. VREAD is sufficient to turn on the selected memory cell 700 if in the erased state, and insufficient to turn on the selected memory cell 700 if in the programmed state (for a one bit cell). In the illustrated embodiment, the voltage value VREAD is substantially the same for each level of memory cells. The string select line 718 is charged to a high value to turn on the string select transistor 712. The ground select line GSL is set to a low value to turn off the block select transistor 706.

The selected local bit line 710 is discharged to ground through M1 and M2 by setting controllable voltage BLCLAMP and timing signal BLPRECHG to high levels and setting controllable voltage BLPWR to ground. The common source line CSL is charged to a high level to charge the unselected local bit lines (not shown). Unselected bit lines are precharged to the level of the common source line CSL, via their respective bias circuits.

During time interval T1, the BLPWR signal is changed to an intermediate voltage value, such as for example 2.3 Volts, to charge the data line DLIB through M2. The BLCLAMP signal is biased to a voltage value VBLCLAMP1 based on the level of the selected memory cell 700. As represented by the four lines in the timing diagram for the value of VBLCLAMP1, a different bias level is used for each array level (corresponding in this architecture to the selected memory cell) for the purpose of providing different judgment criterion that depends on the selected memory cell. In other words, the bit lines in different levels of the array are precharged to different voltage levels. In this manner, the different precharge bit line levels can compensate for the threshold voltage differences among the cells in the levels. The precharged bit line voltage level BL is given by the difference between VBLCLAMP1 and the threshold voltage of transistor M1 during interval T1.

During time interval T2, the BLCLAMP and BLPRECHG signals are set to low levels to turn off M1 and M2, thereby floating the selected bit line 710 and the data line DLIB. The ground select line GSL is charged to a high value to turn on the block select transistor 706, thereby coupling the second end of the NAND string to the common source line CSL 708 (remaining at a high level). The selected bit line 710 will be charged up based on the cell current through the selected memory cell 700, as represented by the four lines on the timing diagram for BL, with diverging lines for high threshold HVT memory states (flat because current is blocked) and low threshold voltage LVT memory states (increasing because current flows from CSL to the DILB). During part of time interval T2, the voltage level at the data line DLIB may be boosted to a higher voltage by applying different voltage levels (VBOOST1) for the VBOOST signal based on the level of the selected memory cell 700. This can provide a larger voltage swing on the data line DLIB during timing interval T3, as represented by the four lines on the timing diagram for VBOOST and for DLIB.

During part of time interval T3, control signal BLCLAMP is biased to a voltage value VBLCLAMP2. VBLCLAMP2 is also based on the level of the selected memory cell 700, as represented by the four lines on the timing diagram for VBLCLAMP2. The voltage value of VBLCLAMP2 can be greater than that of the voltage value VBLCLAMP1 applied during time interval T1. For example, VBLCLAMP2 may be 0.2 Volts greater than VBLCLAMP1, for a given selected memory cell.

If after time interval T2, the selected bit line 710 is charged to a voltage less than the value of VBLCLAMP2 minus the threshold voltage of M1, then M1 turns on when VBLCLAMP2 is applied. This couples the selected bit line 710 to the data line DLIB and equalizes the voltage level between them, as can be seen in the region 800 on the DLIB trace in FIG. 8. Instead, if after time interval T2, the selected bit line 710 is charged to a voltage higher than the value of VBLCLAMP2 minus the threshold voltage of M1, M1 turns off. This holds the voltage level of the data line DLIB.

After setting the voltage level on the data line DLIB, the signal VBOOST is set to a low value to provide a suitable DLIB level for latch set up in the sense amplifier. The sense amplifier can sense the data based on the voltage of DLIB in the time interval at or just before the end of interval T3.

At time T4, all signals recover to an initial state.

Thus an integrated circuit is described in which the memory array includes a plurality of bit lines coupled via respective clamp transistors to corresponding data lines in a set of data lines, the data lines being coupled to corresponding sensing circuits, and wherein the bias circuits are responsive to timing signals during a read operation of a selected memory cell in the memory array, and include a precharge circuit connected to the data line, and a bias voltage source to apply a bias voltage to a control terminal of said clamp transistor that depends on the selected memory cell.

The memory array in this example comprises a NAND array including a plurality of NAND strings having respective ground select transistors and string select transistors, ground select lines and string select lines, and word lines, and including a control circuit coupled to the memory array and the bias circuits, which for the read operation of the selected cell on a selected NAND string, causes a sequence that can be applied simultaneously to the NAND strings for a selected page of memory cells, the sequence including:

in a first time interval T0, charge the word lines coupled to the selected NAND string to target levels for read, and discharge the bit lines to a low reference voltage via the precharge circuit while the ground select transistor is off and the string select transistor is on;

in a second time interval T1, precharge the data line to a read reference voltage and apply a first clamp voltage to the clamp transistor that depends on the selected memory cell, whereby the data line and the bit line for the selected NAND string are precharged to levels that depend on the selected memory cell;

in a third time interval T2, turn off the clamp transistor and disconnect the precharge circuit from the data line, turn on the ground select transistor while applying a read bias voltage to the source line; and in a fourth time interval T3, apply a second clamp voltage, higher than the first claim voltage, to the clamp transistor that depends on the selected memory cell, and sense the level of the data line to indicate a value of data stored in the selected memory cell.

In the embodiment described here, the bias circuits include a boost circuit coupled to the data line, which is responsive to timing signals during the read operation, to capacitively boost a voltage on the data line by a boost amount. A boost voltage source is coupled to the boost circuit to set the boost amount that depends on the selected memory cell, and wherein the sequence includes in or before the fourth time interval, apply a boost voltage to boost the data line before sensing the level of the data line.

The read operations described herein can be applied to memory architectures including 3D arrays, and to memory architectures that do not include 3D arrays, to provide for managing dynamic cell characteristics that result in threshold voltage variations, without applying different WL voltages, or in combination with varying WL voltages in array architectures that allow it.

As described above, in a 3D memory array, the global bit lines are coupled to local bit lines in the various levels of the memory array via vertical connectors and contact pads.

Differences among the vertical connectors and contact pads to the various levels, and other differences among the levels can lead to differences in the overall capacitance among the global bit lines. For example, referring back to FIG. 3, the contact pad 330 and the level 3 vertical connector 300 have a capacitance which is different than that of the contact pad 332 and level 2 vertical connector 302. These differences can lead to variations in the overall capacitance of the global bit lines, which in turn can diminish the read margin both in terms of speed and in terms of voltage and current magnitudes, and can affect other characteristics of the array during operation.

Figure 9:
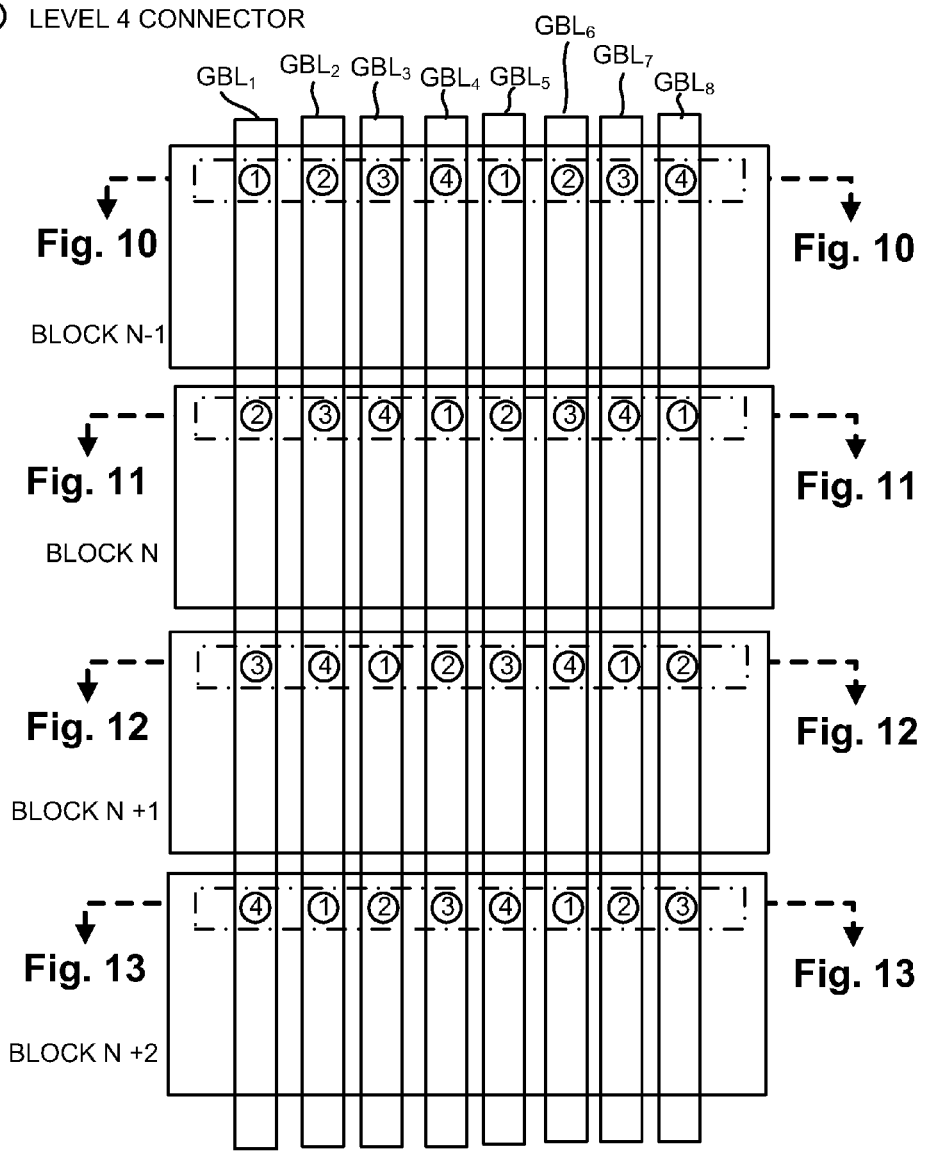
FIG. 9 illustrates an exemplary layout view of the connection of global bit lines to a plurality of blocks having multiple levels of memory cells.
Figure 10:
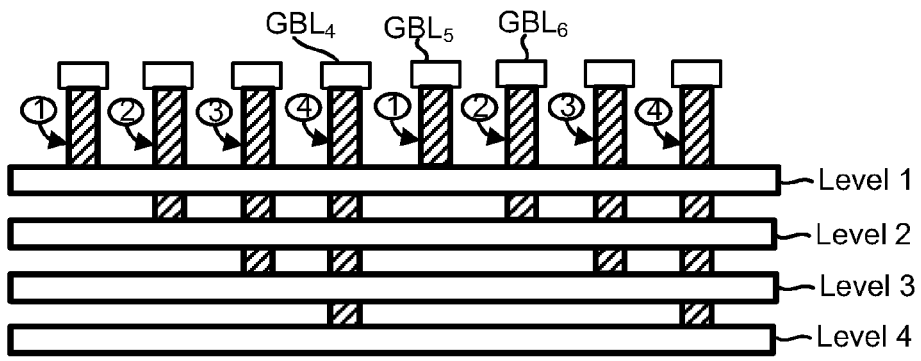
FIGS. 10, 11, 12 and 13 illustrate cross-sectional views of the vertical connectors in the structure illustrated in FIG. 9.
Figure 11:
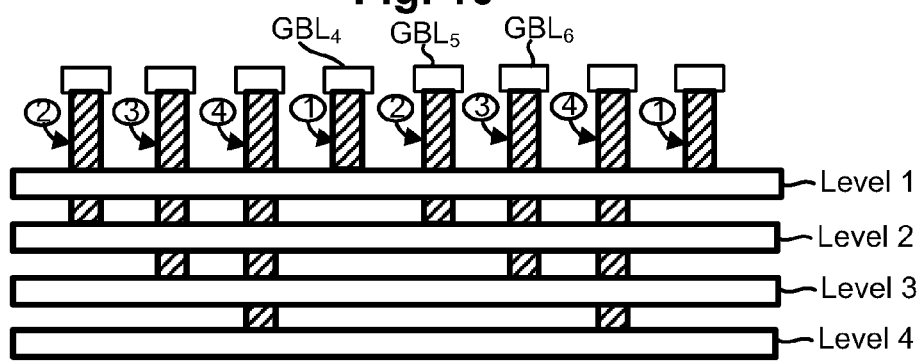
Figure 12:
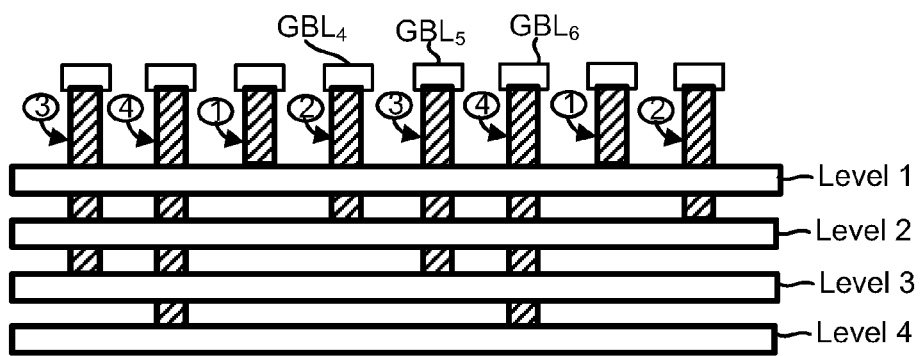
Figure 13:
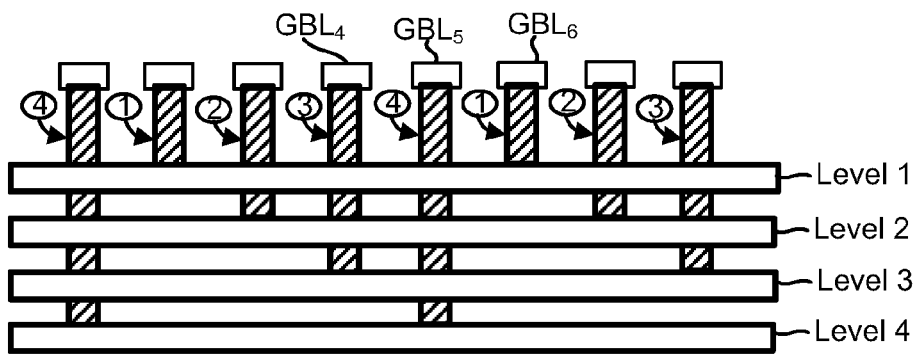

FIG. 9 illustrates an exemplary layout view of the connection of global bit lines $GBL_1$ to $GBL_8$ to a plurality of blocks having multiple levels of memory cells. FIGS. 10, 11, 12 and 13 illustrate cross-sectional views of the vertical connectors for each block.

Each of the blocks comprises a plurality of levels including respective two dimensional arrays of memory cells. Each two dimensional array of memory cells includes a plurality of word lines and a plurality of local bit lines coupled to corresponding memory cells in the array. The two dimensional arrays may for example be implemented in a NAND configuration as described above. Alternatively, other array configurations may be used.

The block size and number of blocks will vary from embodiment to embodiment. In some embodiments, the size of each of the blocks can be for example 2 KB (kilobytes), 4 KB, 8 KB, or 16 KB.

The global bit lines $GBL_1$ to $GBL_8$ are coupled to the local bit lines (not shown) in the various levels of the blocks via vertical connectors. In this illustration, each of blocks includes four levels for simplicity. The level at which a vertical connector couples the overlying global bit line is indicated by the level indices 1, 2, 3 or 4. For example, the global bit line $GBL_1$ is coupled via a level 1 connector to local bit lines within a first level of the memory block Block N−1, coupled via a level 2 connector to local bit lines within a second level of the memory block Block N, coupled via a level 3 connector to local bit lines within a third level of the memory block N+1, and coupled via level 4 connector to local bit lines within a fourth level of the memory block N+2.

The vertical connectors for each block in this example are disposed within a region labeled "stepped connector structure to local bit lines," which can be implemented by arranging contact pads in each level in a stair step manner like that illustrated in FIG. 3.

By coupling each of the global bit lines $GBL_1$ to $GBL_8$ to a variety levels across the array, differences between the capacitances among the global bit lines $GBL_1$ to $GBL_8$ can be small.

In the illustrated embodiment, the connectors are arranged such that a sum of level indices of the corresponding local bit lines for each of the global bit lines $GBL_1$ to $GBL_8$ is equal to a constant. Alternatively, the connectors may be arranged such that another statistical function, such as a mean, of the level indices may be equal to a constant. Generally, the connectors may be arranged to select variations in capacitance among the global bit lines as suits a particular implementation.

In this manner, the differences in the capacitances among the global bit lines $GBL_1$ to $GBL_8$ can be small or controlled within selected limits. This in turn can provide a wide read margin between programmed and erased states.

Figure 14:
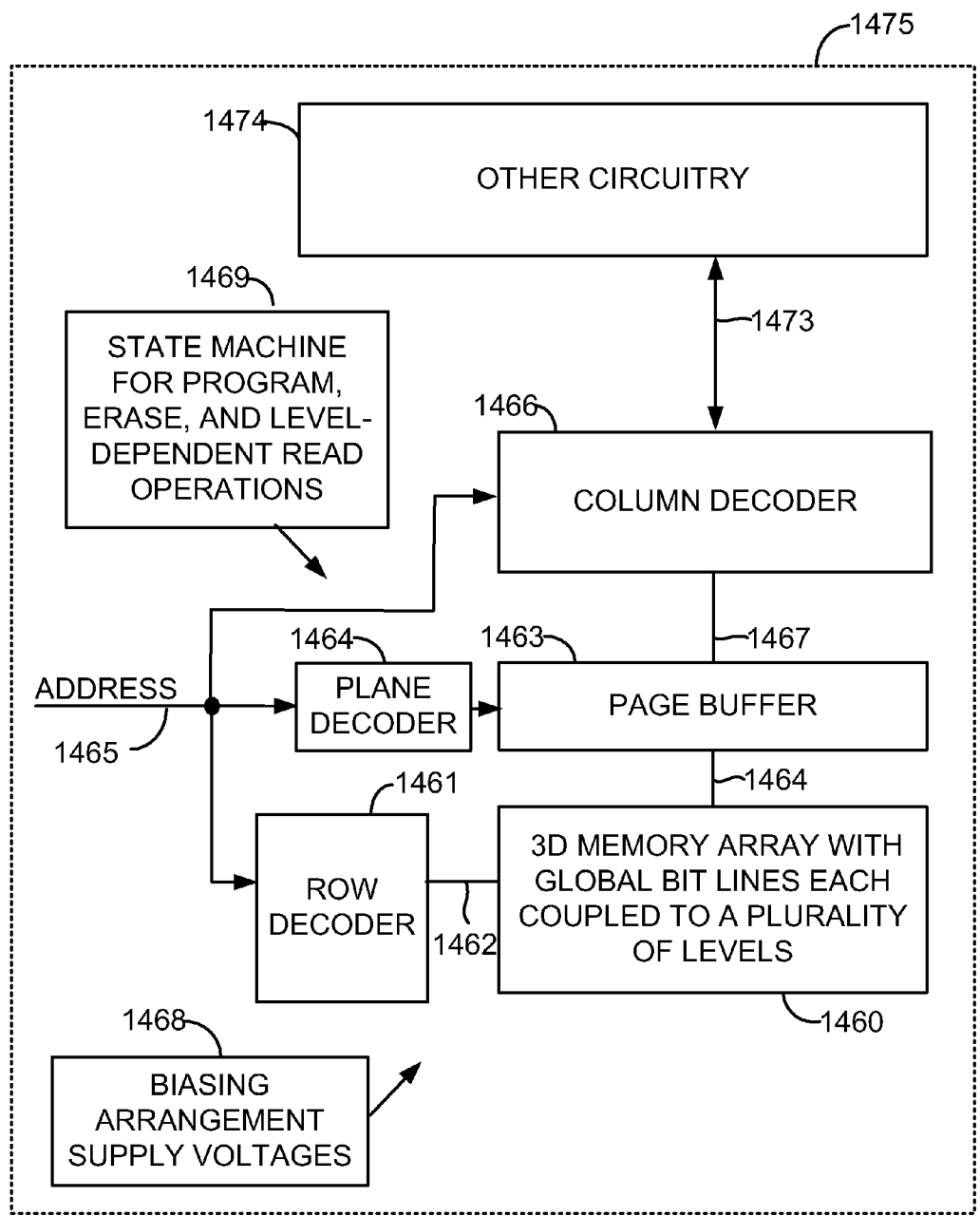
FIG. 14 is a simplified block diagram of an integrated circuit including a 3D memory array having global bit lines which are each coupled to a plurality of levels of memory cells.

FIG. 14 is a simplified block diagram of an integrated circuit 1475 including a 3D memory array 1460 having global bit lines which are each coupled to a plurality of levels of memory cells. A row decoder 1466 is coupled to a plurality of word lines 1462 arranged along rows in the memory array 1460. Column decoder 1466 is coupled to a page buffer 1463 in this example via data bus 1467. Plane decoder 1464 is coupled to the page buffer 1463. The global bit lines 1464 are coupled to local bit lines (not shown) arranged along columns in the various levels of the memory array 1460. Addresses are supplied on bus 1465 to the column decoder 1466, row decoder 1461 and plane decoder 1464. Data is supplied via the line 1473 from input/output ports or from other data sources internal or external to the integrated circuit. In the illustrated embodiment, other circuitry 1474 is included on the integrated circuit, such as a general purpose processor or special purpose application circuitry, or a combination of modules providing system-on-a-chip functionality supported by the array 1460. Data is supplied via the line 1473 to input/output ports or to other data destinations internal or external to the integrated circuit.

A controller, implemented in this example as a state machine 1469, provides control signals to control the application of bias arrangement supply voltages generated or provided through the voltage supply or supplies in block 1468 to carry out the various operations described herein, including erase, program and level-dependent read having different read bias conditions for each level of the array 1460. In combination, the controller 1469 and block 1468 can include the bias circuits and logic represented by the blocks 750-754 in FIG. 7. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 15:
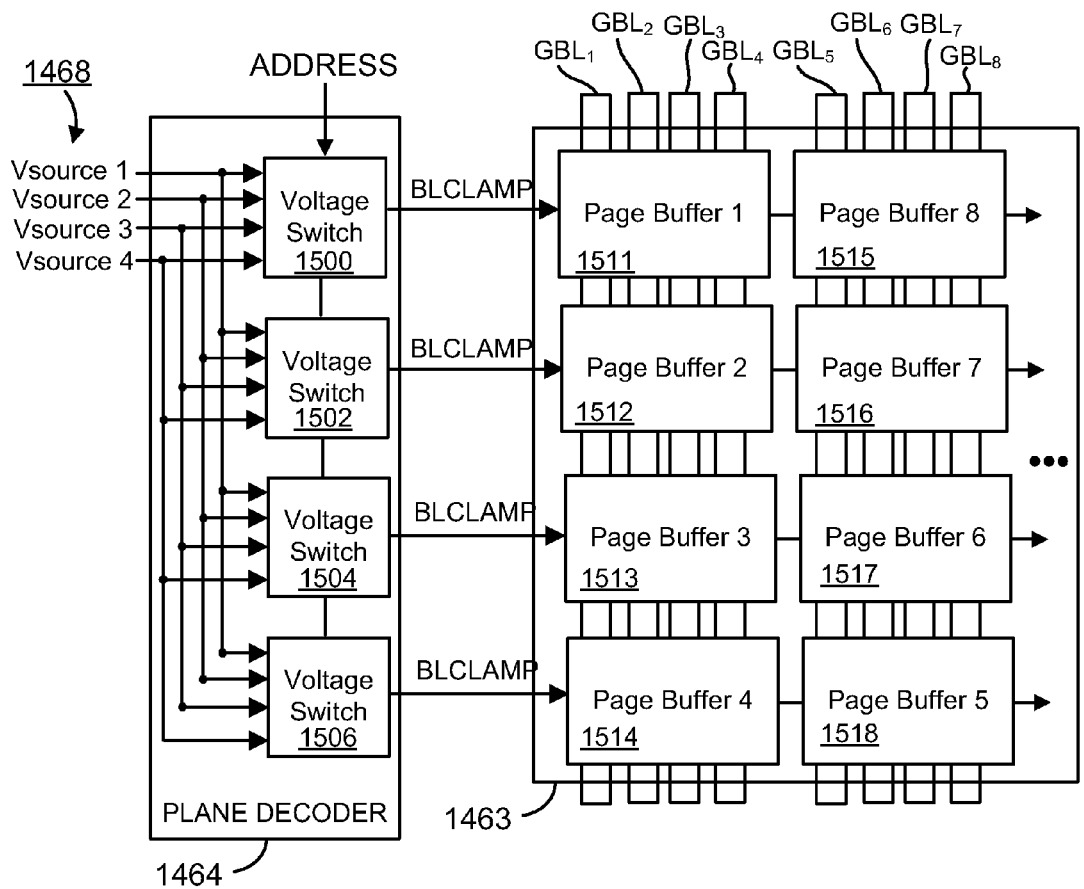
FIG. 15 is a schematic diagram showing the manner in which the global bit lines are connected to page buffers in one decoding structure.

FIG. 15 is a schematic diagram showing the manner in which the global bit lines GBL1 to GBL8 are connected to page buffers 1511-1518, the combination of which corresponds to the page buffer 1463 of FIG. 14. The page buffers 1511-1518 can include circuits like those of FIG. 7, for example. In embodiments including the biasing circuits that compensate bit line biasing for cell location, the page buffers includes a clamp transistor, a boost capacitor, a latch, and charging circuits for bit line power.

A plane decoder, like plane decoder 1464 of FIG. 14, includes switch circuits coupled to the plurality of global bit lines to apply a bias voltage to a selected global bit line depending on the level L(z) of the selected memory cell. The switch circuits in this example comprise the voltage switches 1500, 1502, 1504, 1506. In this example, upon initiating a read operation for an address, the plane decoder 1464 decodes the address to identify the physical location, including the block and the level, of the selected memory cell associated with the address. The switch circuits can be configured to apply bias voltages via the voltage switches simultaneously to the global bit lines selected for accessing the page of memory cells.

The voltage switches 1500, 1502, 1504, 1506 receive different voltage signals Vsource1, Vsource2, Vsource3, Vsource4 generated or provided through the voltage supply or supplies in block 1468 (see FIG. 14). The voltage switches 1500, 1502, 1504, 1506 output one of the voltage signals Vsource1, Vsource2, Vsource3, Vsource4 as a level-dependent control signal BLCLAMP, described above. The level-dependent control signal BLCLAMP is provided to clamp transistors (not shown) within page buffer circuits coupled to the global bit lines $GBL_1$ to $GBL_8$. As described above, the level-dependent control signal BLCLAMP precharges the global bit line and local bit line of the selected memory cell during the level-dependent read operations described herein.

In FIG. 15 each of the page buffers 1511-1518 is coupled to a different global bit line, allowing for wide, parallel read operations.

In the illustrated example, the global bit lines $GBL_1$ and $GBL_8$ are connected to different sets of bit lines within the same level in each block. Thus, the output of the voltage switch 1500 is provided to both the Page Buffer 1 (1511) coupled to the global bit line $GBL_1$, and the Page Buffer 8 (1515) coupled to the global bit line $GBL_8$.

Figure 16:
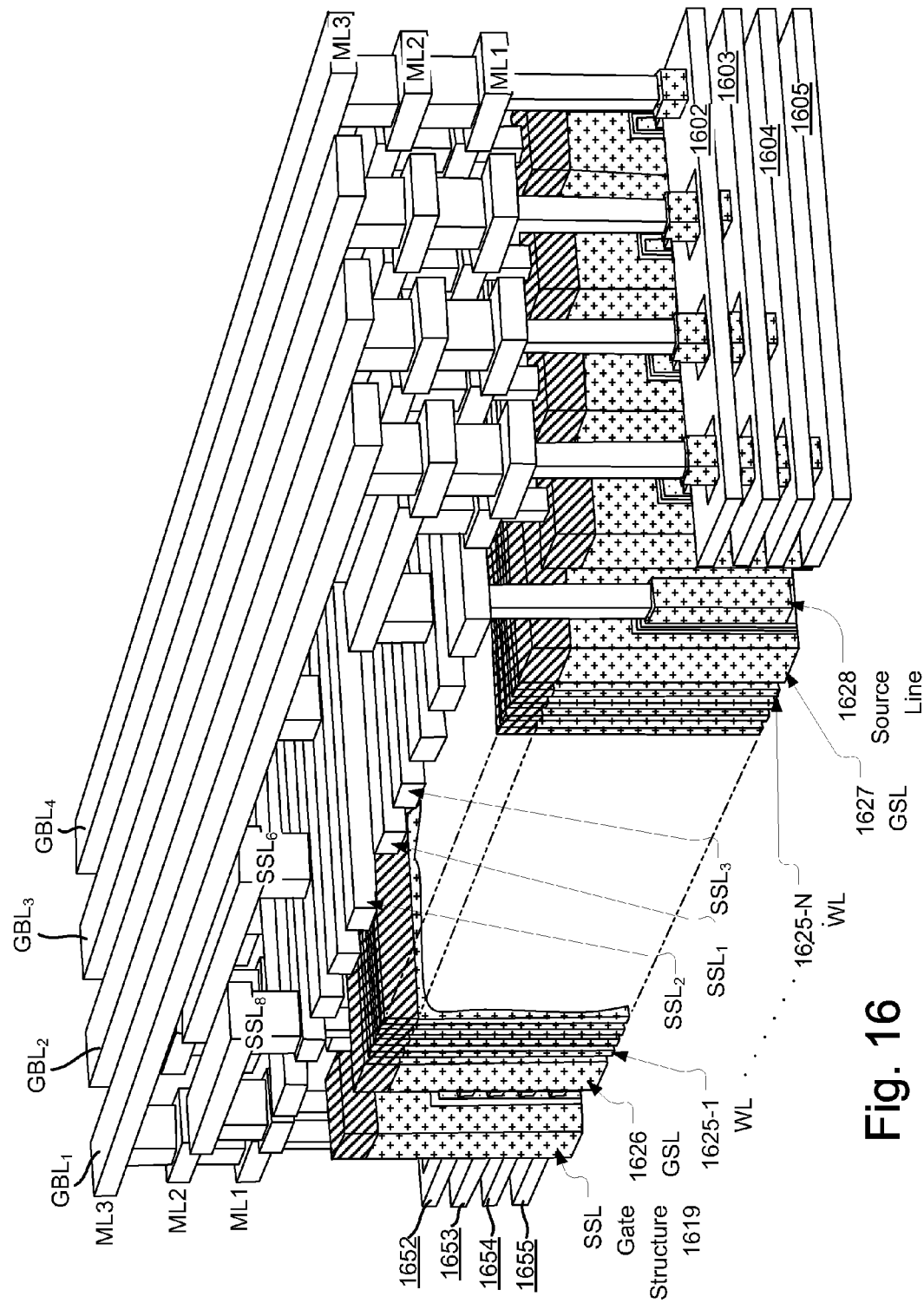
FIG. 16 is a perspective illustration of a 3D NAND flash memory array structure having global bit lines which are each coupled to a plurality of levels of memory cells.

FIG. 16 is a perspective illustration of another example of a 3D NAND flash memory array structure having global bit lines which are each coupled to a plurality of levels of memory cells, and in which a level dependent bias can be applied as described herein. In the illustrated example four levels of memory cells are illustrated, which is representative of a block of memory cells that can include many levels.

Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of conductive lines 1625-1, ..., 1625-n-1, 1625-n conformal with the plurality of ridge-shaped stacks, and which act as word lines WLn, WLn-1, ... WL1. The plurality of ridge-shaped stacks includes semiconductor strips acting as local bit lines. Semiconductor strips in the same level are electrically coupled together by extensions having contact pads arranged in a stair step manner.

The shown word line numbering, ascending from 1 to N going from the back to the front of the overall structure, applies to even memory pages. For odd memory pages, the word line numbering descends from N to 1 going from the back to the front of the overall structure.

As illustrated, the extensions 1602, 1603, 1604, 1605 on a first end of the block are electrically connected to different global bit lines $GBL_1$ to $GBL_4$. Similarly, the extensions 1652, 1653, 1654, 1655 are electrically connected to different global bit lines $GBL_1$ to $GBL_4$.

Any given stack of semiconductor strips is coupled to either the extensions 1602, 1603, 1604, 1605, or the extensions 1652, 1653, 1654, 1655, but not both. A stack of semiconductor strips has one of the two opposite orientations of bit line end-to-source line end orientation, or source line end-to-bit line end orientation.

The stacks of semiconductor strips terminated at one end by the extensions 1652, 1653, 1654, 1655, pass through SSL gate structure 1619, ground select line GSL 1626, word lines 1625-1 WL through 1625-N WL, ground select line GSL 1627, and terminated at the other end by source line 1628. These stacks of semiconductor strips do not reach the extensions 1602, 1603, 1604, 1605.

The stacks of semiconductor strips terminated at one end by the extensions 1602, 1603, 1604, 1605, passes through SSL gate structure 1609, ground select line GSL 1627, word lines 1625-N WL through 1625-1 WL, ground select line GSL 1626, and terminated at the other end by a source line (obscured by other parts of figure). These stacks of semiconductor strips do not reach the extensions 1652, 1653, 1654, 1655.

Charge storage structures separate the word lines 1625-1 through 1625-n, from the semiconductor strips. Ground select lines GSL 1626 and GSL 1627 are conformal with the plurality of ridge-shaped stacks, similar to the word lines.

Global bit lines $GBL_1$ to $GBL_4$ are formed at the metal layers ML1, ML2, and ML3. Although obscured by other parts of figure, in the illustrated example, each global bit line $GBL_1$ to $GBL_4$ is coupled to two different levels of the block of memory cells. For example, in the illustration the global bit line $GBL_1$ is coupled to extension 1605 which is connected to a set of semiconductor strips acting as local bit lines in the fourth level, and is coupled to extension 1652 which is connected to a set of semiconductor strips acting as local bit lines in the first level. This is discussed further in FIG. 17 below.

Figure 17:
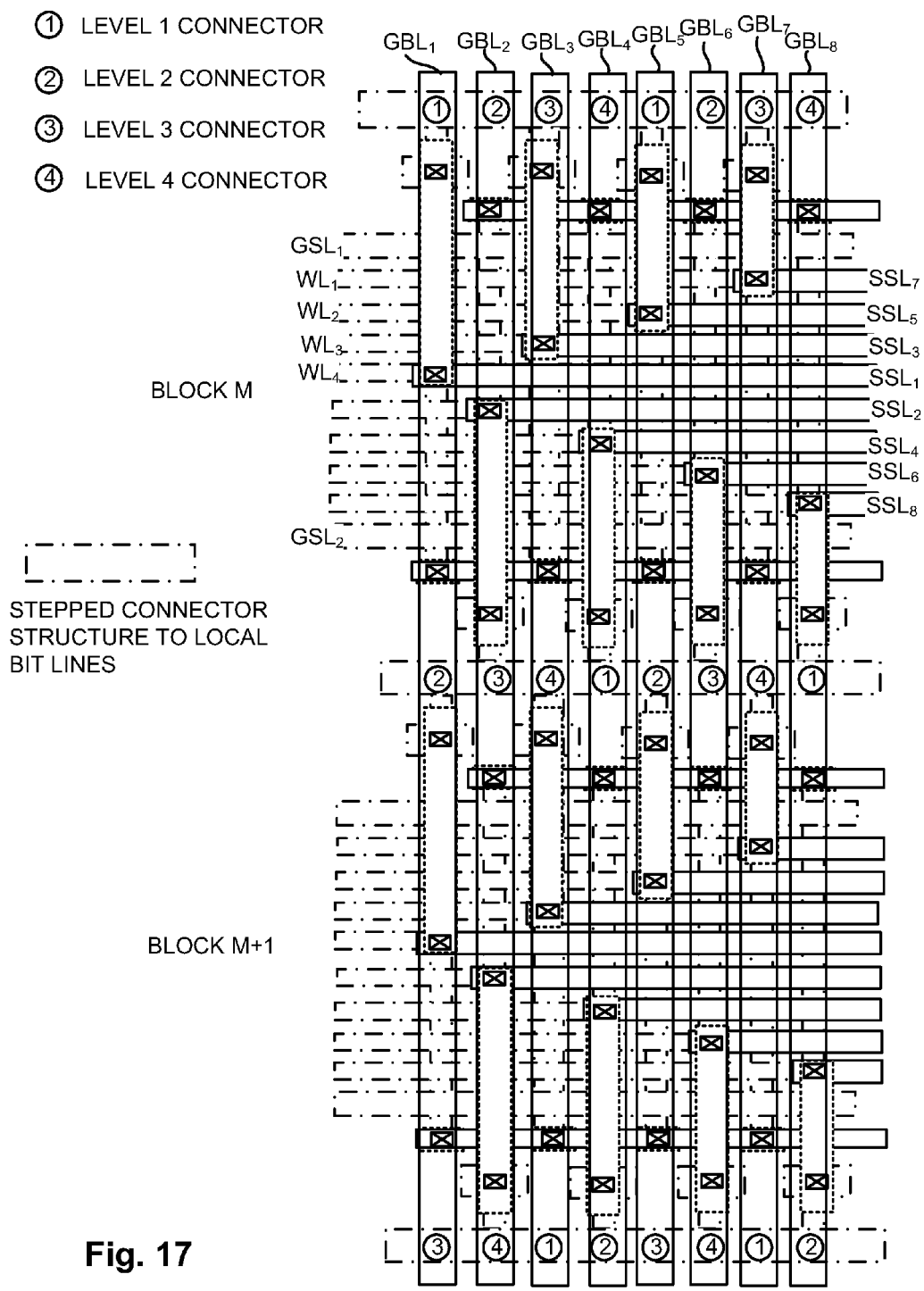
FIG. 17 illustrates an exemplary layout view of the connection of global bit lines to a plurality of multi-level blocks having memory cells arranged in the configuration illustrated in FIG. 16.

FIG. 17 illustrates an exemplary layout view of the connection of global bit lines $GBL_1$ to $GBL_8$ to a plurality of multi-level blocks having memory cells arranged in the configuration illustrated in FIG. 16.

The global bit lines $GBL_1$ to $GBL_8$ are coupled to the local bit lines (not shown) in the various levels of the blocks via vertical connectors. In this illustration, each of blocks includes four levels for simplicity. The level at which a vertical connector couples the overlying global bit line is indicated by the level indices 1, 2, 3 or 4.

For example, the global bit line $GBL_1$ is coupled via a level 1 connector to a set of local bit lines within a first level of the memory block Block M, coupled via a level 2 connector to a set of local bit lines within a second level of the memory block Block M, and coupled via a level 3 connector to a set of local bit lines within a third level of the memory block Block M+1.

The vertical connectors for each block are within a region labeled "stepped connector structure to local bit lines," which can be implemented by arranging contact pads in each level in a stair step manner similar to that illustrated in FIG. 17.

In the example of FIGS. 16 and 17, the global bit lines $GBL_1$ to $GBL_8$ are patterned in third metal layer, while string select lines $SSL_1$ to $SSL_8$ are patterned in first and second metal layers. The string select signals are coupled to string select transistors on alternating ends of the blocks, via a first metal segment parallel with the underlying string, and a second metal segment parallel with the word lines. The segments parallel with the word lines in the Block M are labeled $SSL_1$ to $SSL_8$ in the illustration. Vertical connections among the metal layers are indicated with "X'ed" boxes. Word lines $WL_x$ and even and odd ground select lines $GSL_1$ and $GSL_2$ on the top and bottom of each block are implemented in this example in a patterned conductor layer, such as a polysilicon layer, beneath the first metal layer.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
   a memory array; and
   bias circuits that compensate for variations in threshold voltages corresponding to memory states of memory cells in the array by applying different bias conditions to bit lines selected for a read operation.

2. The integrated circuit of claim 1, the memory array including a plurality of bit lines coupled via respective clamp transistors to corresponding data lines in a set of data lines, the data lines being coupled to corresponding sensing circuits, and wherein the bias circuits are responsive to timing signals during a read operation of a selected memory cell in the memory array, and include a precharge circuit connected to the data line, and a bias voltage source to apply a bias voltage to a control terminal of said clamp transistor that depends on the selected memory cell.

3. The integrated circuit of claim 2, wherein the memory array comprises a NAND array including a plurality of NAND strings having respective ground select transistors and string select transistors, ground select lines and string select lines, and word lines, and including a control circuit coupled to the memory array and the bias circuits, which for the read operation of the selected cell on a selected NAND string, causes a sequence including:
   in a first time interval T0, charge the word lines coupled to the selected NAND string to target levels for read, and discharge the bit lines to a low reference voltage via the precharge circuit while the ground select transistor is off and the string select transistor is on;
   in a second time interval T1, precharge the data line to a read reference voltage and apply a first clamp voltage to the clamp transistor that depends on the selected memory cell, whereby the data line and the addressing line for the selected NAND string are precharged to levels that depend on the selected memory cell;
   in a third time interval T2, turn off the clamp transistor and disconnect the precharge circuit from the data line, turn on the ground select transistor while applying a read bias voltage to the source line; and in a fourth time interval T3, apply a second clamp voltage, higher than the first claim voltage, to the clamp transistor that depends on the selected memory cell, and sense the level of the data line to indicate a value of data stored in the selected memory cell.

4. The integrated circuit of claim 3, wherein the bias circuits include a boost circuit coupled to the data line, which is responsive to timing signals during the read operation, to capacitively boost a voltage on the data line by a boost amount.

5. The integrated circuit of claim 3, wherein the bias circuits include a boost circuit coupled to the data line, which is responsive to timing signals during the read operation, to capacitively boost a voltage on the data line by a boost amount, and a boost voltage source coupled to the boost circuit to set the boost amount that depends on the selected memory cell, and wherein the sequence includes in or before the fourth time interval, apply a boost voltage to boost the data line before sensing the level of the data line.

6. The integrated circuit of claim 1, wherein the word line voltages applied to the memory cells in the array are substantially the same during the different bias conditions.

7. The integrated circuit of claim 1, wherein the memory array includes a plurality of blocks, blocks in the plurality of blocks comprising a plurality of levels $L(z)$, levels $L(z)$ in the plurality of levels including respective two dimensional arrays of memory cells, respective two dimensional arrays including a plurality of word lines and a plurality of local bit lines coupled to corresponding memory cells in the array; and
   a plurality of global bit lines, global bit lines in the plurality of global bit lines including a plurality of connectors, connectors in the plurality of connectors coupled to a given global bit line being coupled to corresponding local bit lines in the plurality of blocks, the bias circuits coupled to the plurality of global bit lines.

8. An integrated circuit, comprising:
   a plurality of blocks, blocks in the plurality of blocks comprising a plurality of levels $L(z)$, levels $L(z)$ in the plurality of levels including respective two dimensional arrays of memory cells, respective two dimensional arrays including a plurality of local bit lines coupled to corresponding memory cells in the array;
   a plurality of global bit lines, global bit lines in the plurality of global bit lines including a plurality of connectors, connectors in the plurality of connectors coupled to a given global bit line being coupled to corresponding local bit lines in the plurality of blocks, and wherein the corresponding local bit line in one of the plurality of blocks is on a different level $L(z)$ than the corresponding local bit line in another of the plurality of blocks; and
   switch circuits coupled to the plurality of global bit lines, the switch circuits configured to apply respective bias voltages to corresponding global bit lines depending on the level $L(z)$ of a selected memory cell.

9. The integrated circuit of claim 8, wherein there are N levels $L(z)$ (level index $z=1$ to N) in each of the plurality of blocks, and the connectors are arranged on each global bit line in the plurality of global bit lines such that a statistical function of level indexes for the levels $L(z)$ of the corresponding local bit lines is equal to a constant.

10. The integrated circuit of claim 9, wherein a level in the plurality of levels in a given block in the plurality of blocks includes a contact pad connected to a connector in the plurality of connectors on a corresponding global bit line, and switches selectively connecting the contact pad to the corresponding local bit line.

11. The integrated circuit of claim 10, wherein arrays comprise NAND arrays, and the switches comprise string select transistors.

12. The integrated circuit of claim 8, including bias circuits coupled to the switch circuits that compensate for variations in threshold voltages corresponding to memory states of selected memory cells, based on the level $L(z)$ of the selected memory cell.

13. The integrated circuit of claim 8, including buffers coupled to the plurality of global bit lines and to the switch circuits.

14. An integrated circuit comprising:
   a memory array including a plurality of levels of memory cells, levels in the plurality of levels including local bit lines and memory cells coupled to the local bit lines;
   global bit lines coupled to corresponding sets of local bit lines in the array;
   decoding circuitry to select memory cells in the plurality of levels; and
   bias circuits coupled to the global bit lines for providing selected bias voltages, and responsive to control signals to select a bias voltage for the global bit line that corresponds to the level of a selected memory cell.

15. The integrated circuit of claim 14, wherein the set of local bit lines coupled to a given one of the global bit lines includes local bit lines in more than one level of the memory array.

16. The integrated circuit of claim 14, wherein there are N levels $L(z)$ (level index $z=1$ to N) in the memory array, and sets of local bit lines coupled to respective global bit lines in the plurality of global bit lines are arranged such that a statistical function (e.g. a sum or a mean) of level indexes for the levels $L(z)$ of the set local bit lines corresponding to each global bit line in the plurality of global bit lines, is equal to a constant.

17. The integrated circuit of claim 16, wherein a level in the plurality of levels in a memory array includes a contact pad connected to a connector on a corresponding global bit line, and switches selectively connecting the contact pad to the corresponding local bit line.

18. The integrated circuit of claim 14, the global bit lines being coupled via respective clamp transistors to corresponding data lines in a set of data lines, the data lines being coupled to corresponding sensing circuits, and wherein the bias circuits are responsive to timing signals during a read operation of a selected memory cell in the memory array, and include a precharge circuit connected to the data line, and a bias voltage source to apply a bias voltage to a control terminal of said clamp transistor that depends on the level of the selected memory cell.

19. The integrated circuit of claim 18, wherein the memory array comprises a NAND array including a plurality of NAND strings having respective ground select transistors and string select transistors, ground select lines and string select lines, and word lines, and including a control circuit coupled to the memory array and the bias circuits, which for the read operation of the selected cell on a selected NAND string, causes a sequence including:
   in a first time interval T0, charge the word lines coupled to the selected NAND string to target levels for read, and discharge the global bit lines to a low reference voltage via the precharge circuit while the ground select transistor is off and the string select transistor is on;

in a second time interval T1, precharge the data line to a read reference voltage and apply a first clamp voltage to the clamp transistor that depends on the selected memory cell, whereby the data line and the bit line for the selected NAND string are precharged to levels that depend on the selected memory cell;

in a third time interval T2, turn off the clamp transistor and disconnect the precharge circuit from the data line, turn on the ground select transistor while applying a read bias voltage to the source line; and in a fourth time interval T3, apply a second clamp voltage, higher than the first claim voltage, to the clamp transistor that depends on the selected memory cell, and sense the level of the data line to indicate a value of data stored in the selected memory cell.

20. The integrated circuit of claim 18, wherein the bias circuits include a boost circuit coupled to the data line, which is responsive to timing signals during the read operation, to capacitively boost a voltage on the data line by a boost amount.

21. The integrated circuit of claim 18, wherein the bias circuits include a boost circuit coupled to the data line, which is responsive to timing signals during the read operation, to capacitively boost a voltage on the data line by a boost amount, and a boost voltage source coupled to the boost circuit to set the boost amount that depends on the selected memory cell, and wherein the sequence includes in or before the fourth time interval, apply a boost voltage to boost the data line before sensing the level of the data line.

\* \* \* \* \*